(12) United States Patent
Murata

(10) Patent No.: US 11,924,976 B2
(45) Date of Patent: Mar. 5, 2024

(54) WORK MACHINE

(71) Applicant: FUJI CORPORATION, Chiryu (JP)

(72) Inventor: Takashi Murata, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 254 days.

(21) Appl. No.: 17/283,353

(22) PCT Filed: Oct. 11, 2018

(86) PCT No.: PCT/JP2018/037879
§ 371 (c)(1),
(2) Date: Apr. 7, 2021

(87) PCT Pub. No.: WO2020/075256
PCT Pub. Date: Apr. 16, 2020

(65) Prior Publication Data
US 2022/0007559 A1 Jan. 6, 2022

(51) Int. Cl.
B23P 19/00 (2006.01)
H05K 13/04 (2006.01)
H05K 13/08 (2006.01)

(52) U.S. Cl.
CPC ........... H05K 13/081 (2018.08); H05K 13/04 (2013.01)

(58) Field of Classification Search
CPC .. H05K 13/04; H05K 13/0413; H05K 13/081; H05K 13/0812
See application file for complete search history.

(56) References Cited

U.S. PATENT DOCUMENTS

| 7,185,422 | B2* | 3/2007 | Sakai | H05K 13/041 198/574 |
| 9,168,602 | B2* | 10/2015 | Otsuki | B23F 9/02 |
| 11,229,923 | B2* | 1/2022 | Ikushima | H01L 21/6715 |
| 2018/0047180 | A1 | 2/2018 | Tanaka et al. | |
| 2021/0161044 | A1* | 5/2021 | Nagaishi | G06T 7/80 |

FOREIGN PATENT DOCUMENTS

| JP | 2002-280799 A | 9/2002 |
| JP | 2008-153458 A | 7/2008 |
| JP | 2011-228583 A | 11/2011 |
| WO | WO 2016/147332 A1 | 9/2016 |

OTHER PUBLICATIONS

International Search Report dated Dec. 4, 2018 in PCT/JP2018/037879 filed on Oct. 11, 2018, 2 pages.

* cited by examiner

Primary Examiner — Paul D Kim
(74) Attorney, Agent, or Firm — Oblon, McClelland, Maier & Neustadt, L.L.P.

(57) ABSTRACT

A work machine comprising a work head configured to hold an electrical component having multiple lead terminals; a moving device configured to move the work head in the up-down direction; an imaging device configured to image the electrical component held with work head while being illuminated from the side; and a control device configured to control the operation of the work head and the moving device; wherein the control device calculates the inclination of an electrical component held by the work head based on imaging data of lead terminals of the electrical component imaged by the imaging device while the work head is moved in the up-down direction by the moving device, so that the mounting work of the electrical component is performed by taking the calculated inclination into account.

5 Claims, 16 Drawing Sheets

WORK MACHINE

TECHNICAL FIELD

The present disclosure relates to a work machine for performing a mounting operation of electrical components having multiple lead terminals.

BACKGROUND ART

As described in the following Patent Literature, some work machines perform mounting work of electrical components having multiple lead terminals.

PATENT LITERATURE

Patent Literature 1: JP 2008-153458
Patent Literature 2: JP 2011-228583

BRIEF SUMMARY

Technical Problem

The object of the present disclosure is to appropriately perform mounting work of electrical components having multiple lead terminals.

Solution to Problem

In order to solve the above problem, the present specification discloses a work machine for performing a mounting work of an electrical component, the work machine comprising: a work head configured to hold the electrical component having multiple lead terminals; a moving device configured to move the work head in the up-down direction; an imaging device configured to image the electrical component held with work head while being illuminated from the side; and a control device configured to control the operation of the work head and the moving device; wherein the control device calculates the inclination of an electrical component held by the work head based on imaging data of lead terminals of the electrical component imaged by the imaging device while the work head is moved in the up-down direction by the moving device, the mounting work of the electrical component being performed by taking the calculated inclination into account.

Advantageous Effects

According to the present disclosure, the inclination of the electrical component held in the work head is calculated based on the imaging data of the lead terminals of the electrical component imaged by the imaging device while the work head is moved in the up-down direction, and the mounting work of the electrical component is performed taking the inclination into account. With this configuration, it is possible to appropriately perform mounting work of electrical component having multiple lead terminals.

DESCRIPTION OF EMBODIMENTS

Hereinafter, as a form for carrying out the present disclosure, an embodiment of the present disclosure will be described in detail with reference to the drawings.

(A) Configuration of the Component Mounting Machine

Figure 1:
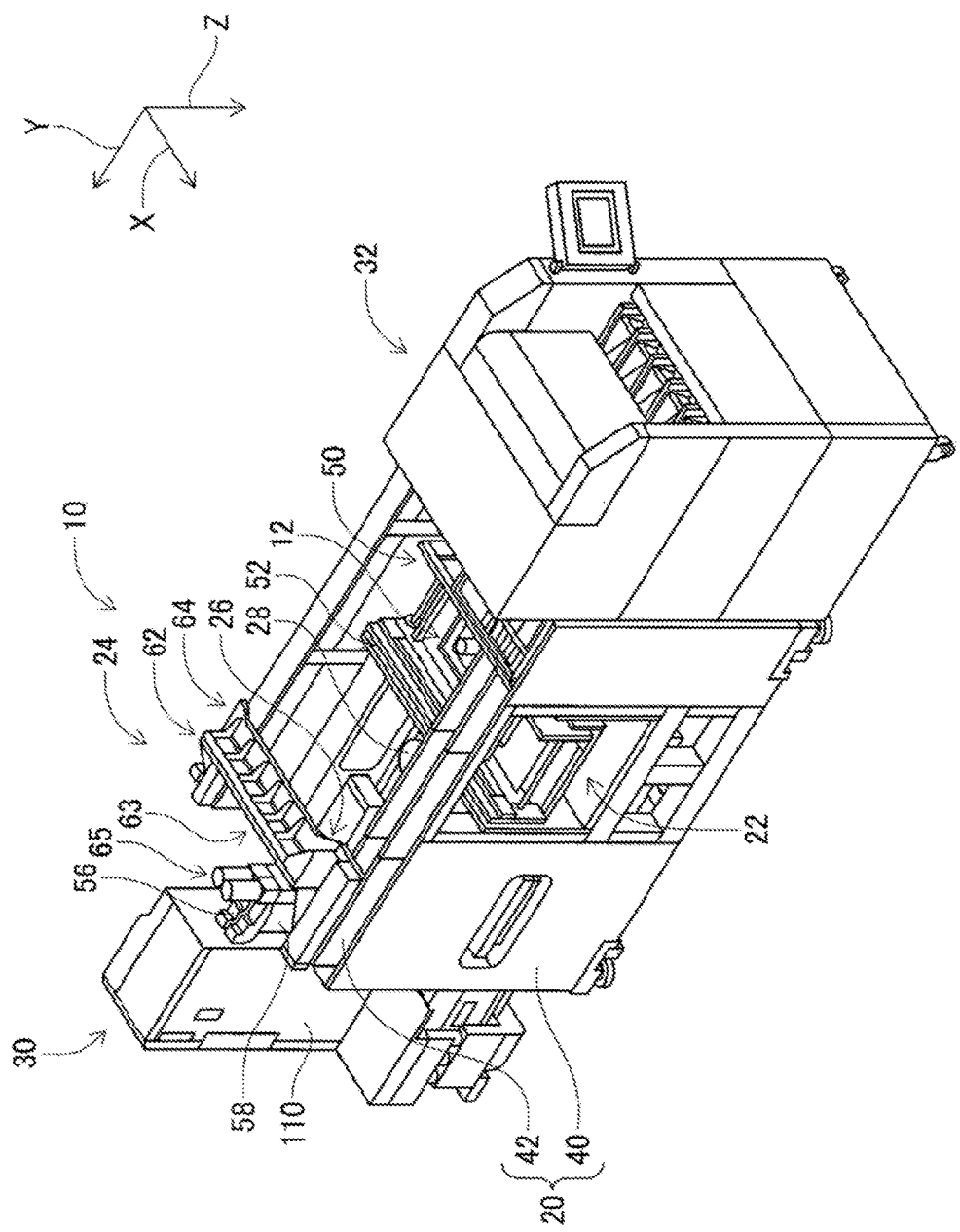
FIG. 1 A perspective view showing a component mounting machine.

FIG. 1 shows component mounting machine 10. Component mounting machine 10 is a device for executing the mounting of components to circuit substrate 12. Component mounting machine 10 includes device main body 20, substrate conveyance and holding device 22, component mounting device 24, mark camera 26, part camera 28, component supply device 30, bulk component supply device 32, and control device (see FIG. 5) 36. Examples of circuit substrates 12 include circuit boards, substrates having a three-dimensional structure, and the like, and examples of circuit boards include a printed wiring board, a printed circuit board, and the like.

Device main body 20 includes frame section 40 and beam section 42, which is overlaid on frame section 40. Substrate conveyance and holding device 22 is disposed at the center in the front-rear direction of frame section 40, and has conveyance device 50 and clamping device 52. Conveyance device 50 is a device for conveying circuit substrate 12, and clamping device 52 is a device for holding circuit substrate 12. Thus, substrate conveyance and holding device 22 conveys circuit substrate 12 and holds circuit substrate 12 in a fixed manner at a predetermined position. In the following description, the conveyance direction of circuit substrate 12 is referred to as the X-direction, the horizontal direction perpendicular to the X-direction is referred to as the Y-direction, and the vertical direction is referred to as the Z-direction. That is, the width direction of component mounting machine 10 is the X-direction, and the front-rear direction is the Y-direction.

Figure 2:
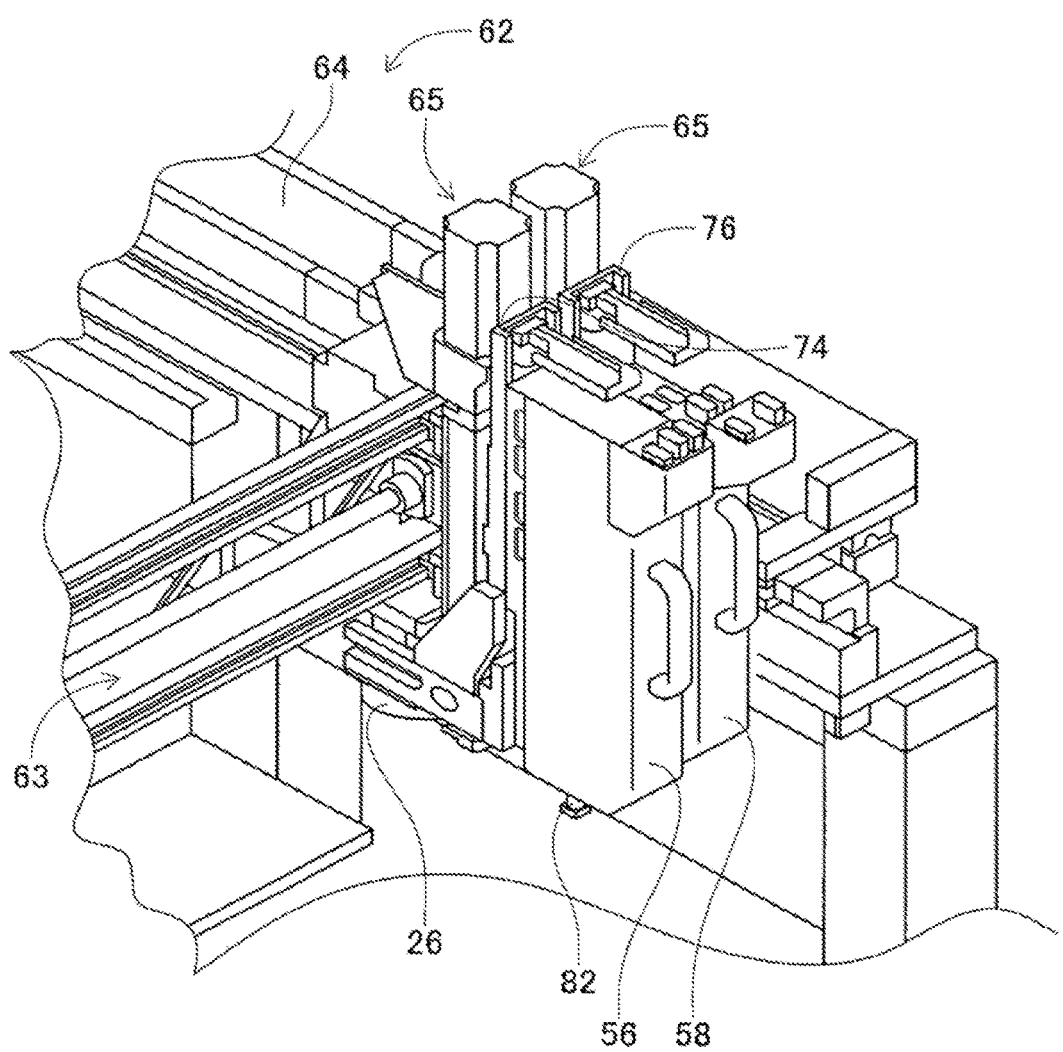
FIG. 2 A perspective view showing a component mounting device of the component mounting machine.

Component mounting device 24 is disposed on beam section 42 and has two work heads 56, 58 and work head moving device 62. Work head moving device 62, as shown in FIG. 2, is constituted by X-direction moving device 63, Y-direction moving device 64, and Z-direction moving device 65. X-direction moving device 63 and Y-direction moving device 64 each have an electromagnetic motor (see FIG. 5) 66, 68, and with the actuation of each electromagnetic motor 66, 68, two work heads 56, 58 move integrally to any position on frame section 40. Z-direction moving device 65 includes electromagnetic motors (refer to FIG. 5) 70, 72, whereby sliders 74, 76 are individually moved in the up-down direction by corresponding electromagnetic motors 70, 72. Work heads 56, 58 are detachably attached to sliders 74, 76. As a result, work heads 56, 58 are moved individually in the up-down direction by Z-direction moving device 65.

Figure 3:
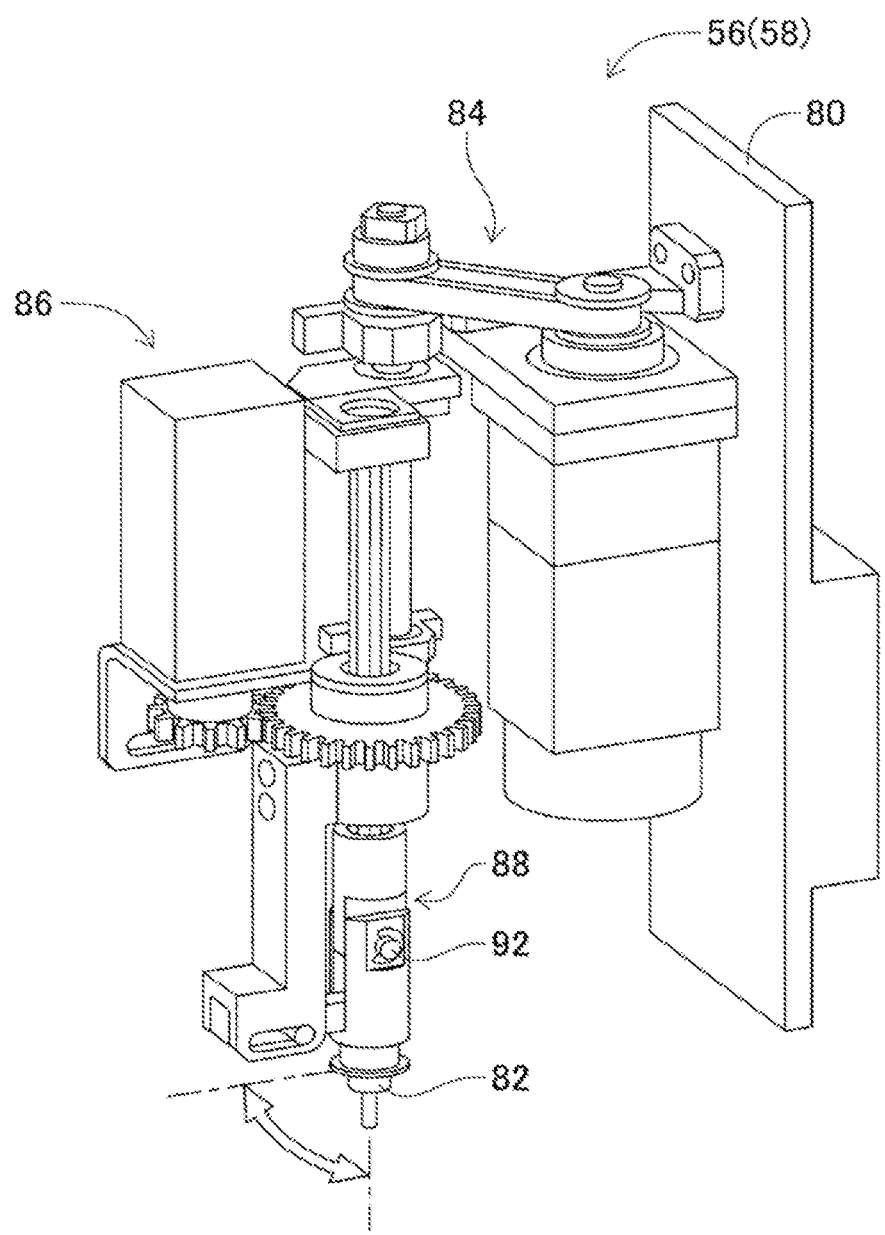
FIG. 3 A schematic diagram showing a work head.

Further, each of work heads 56, 58 is configured to mount a component to circuit substrate 12, and, as shown in FIG. 3, includes head main body 80, suction nozzle 82, nozzle pivoting device 84, and nozzle rotation device 86. FIG. 3 shows work head 56, 58 with the cover (not shown) is removed. Head main body 80 is detachably attached to slider 74, 76. Suction nozzle 82 is detachably attached to the lower end of holder 88 and communicates with positive and negative pressure supply device (see FIG. 5) 90 via negative pressure air and positive pressure air passages. Suction nozzle 82 then picks up and holds the electronic component by negative pressure, and then releases the held electronic component by positive pressure. Holder 88 is bendable at support shaft 92, and by the operation of nozzle pivoting device 84, holder 88 is bent 90 degrees upward. Thus, suction nozzle 82, which is attached to the lower end of holder 88, is rotated 90 degrees to the pivoted position. That is, suction nozzle 82 is pivoted between the non-pivoted position and the pivoted position by the operation of nozzle pivoting device 84. Of course, it is also possible to position a stop at an angle between the non-pivoted position and the pivoted position. Further, nozzle rotation device 86 rotates suction nozzle 82 around its axis.

Further, mark camera 26, as shown in FIG. 2, is attached to slider 74 in a downward-facing state, and together with work head 56, moves in the X-direction, Y-direction, and Z-direction. Thus, mark camera 26 is moved to any position by the operation of work head moving device 62, and mark camera 26 images any position on frame section 40.

Figure 4:
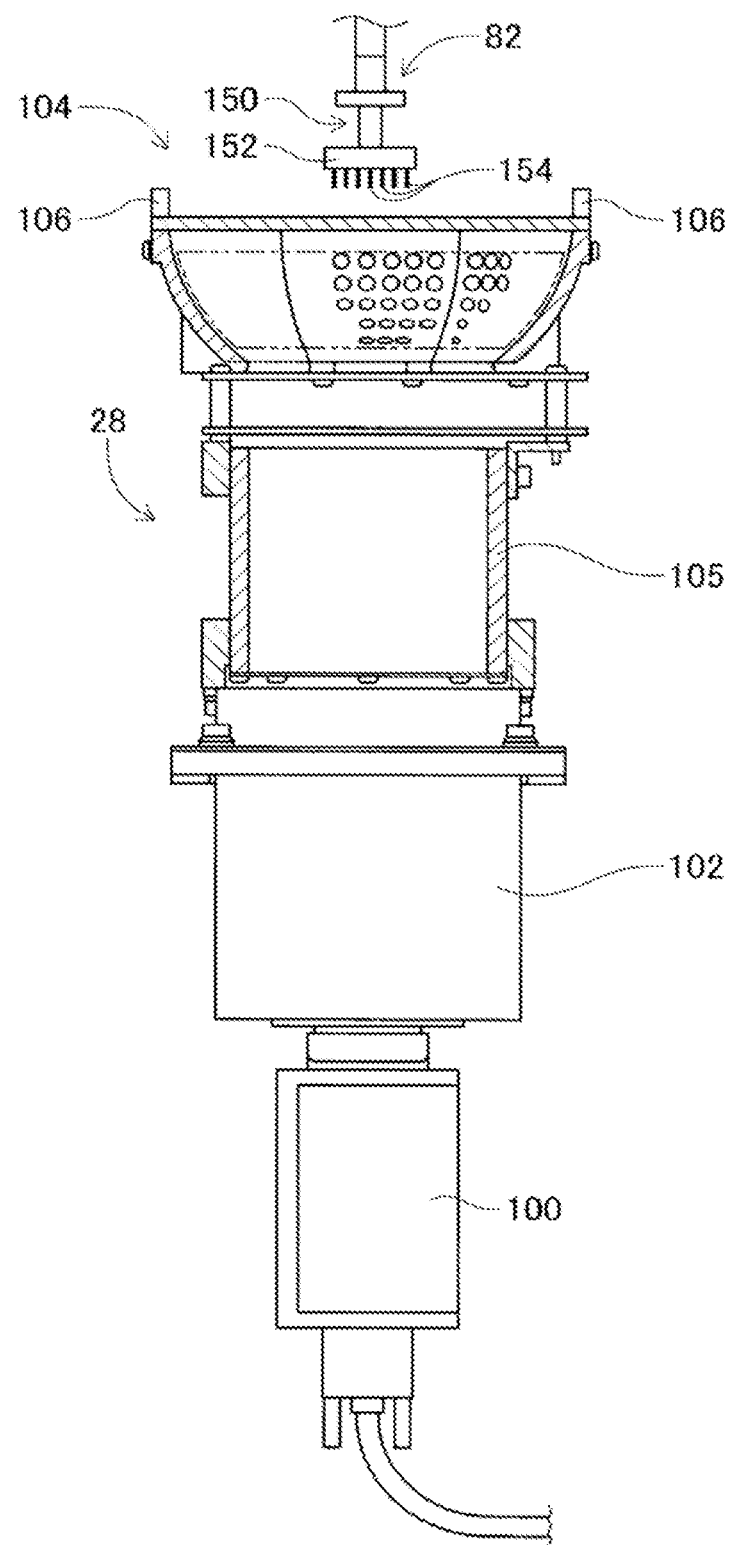
FIG. 4 A schematic diagram showing a part camera.

Further, as shown in FIG. 1, part camera 28 is disposed between substrate conveyance and holding device 22 and component supply device 30 on frame section 40, and faces upward. Thus, work head 56/58 holding the component is moved to a position above component camera 28 by the operation of work head moving device 62 enabling part camera 28 to image the component held by suction nozzle 82. Specifically, as shown in FIG. 4, part camera 28 includes imaging device 100, lens 102, and laser lighting 104. Imaging device 100 has an imaging element (not shown) and is disposed with the light receiving face upward. Lens 102 is fixed to the light receiving face of imaging device 100, that is, the upper face in FIG. 4, and laser lighting 104 is provided on lens 102 via box-shaped member 105 and the like. Laser lighting 104 is composed of four laser irradiation devices (only two laser irradiation devices are shown in the FIG. 106. Four laser irradiation devices 106 are arranged at four equidistant positions so as to surround the component held by suction nozzle 82 from the periphery. Four laser irradiation devices 106 then irradiate toward the component held by suction nozzle 82 from the four lateral locations. As a result, the component held by suction nozzle 82 is imaged by imaging device 100.

Component supply device 30 is provided at one end in the front-rear direction of frame section 40 as shown in FIG. 1. Component supply 30 has tray-type component feeder 110 and feeder-type component feeder (see FIG. 5) 112. Tray-type component feeder 110 is a device for supplying components placed on tray (see FIG. 6) 116. Feeder-type component feeder 112 is a device for supplying components by a tape feeder or a stick feeder (not shown).

Bulk component supply device 32 is disposed at the other end in the front-rear direction of frame section 40. Bulk component supply device 32 is a device for aligning multiple scattered components and supplying the components in an aligned state. That is, bulk component supply device 32 is a device for aligning multiple components in any orientation to a predetermined orientation and supplying the components in the predetermined orientation.

Figure 5:
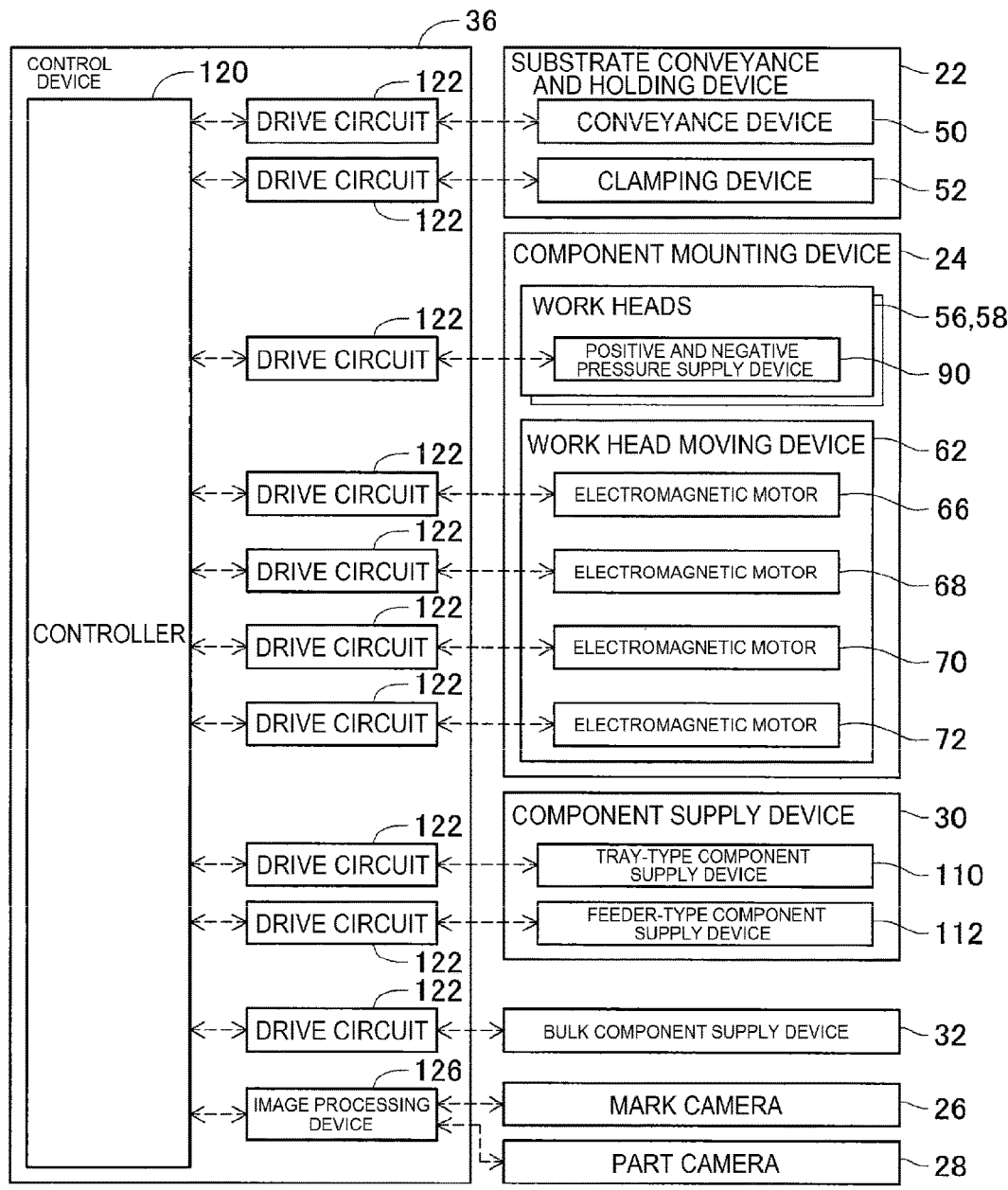
FIG. 5 A block diagram showing a control device.

Control device 36, as shown in FIG. 5, includes controller 120, multiple drive circuits 122, and image processing device 126, as shown in FIG. 5. Multiple drive circuits 122 are connected to conveyance device 50, clamping device 52, electromagnetic motors 66, 68, 70, 72, positive and negative pressure supply device 90, tray-type component supply device 110, feeder-type component supply device 112, and bulk component supply device 32. Controller 120 includes a CPU, ROM, RAM, and the like and is mainly a computer connected to multiple drive circuits 122. With this configuration, controller 120 controls operations of substrate conveyance and holding device 22, component mounting device 24, and the like. Controller 120 is also connected to image processing device 126. Image processing device 126 processes image data obtained by mark camera 26 and part camera 28, and controller 120 acquires various types of information from the image data.

(B) Operation of the Component Mounting Machine

Figure 6:
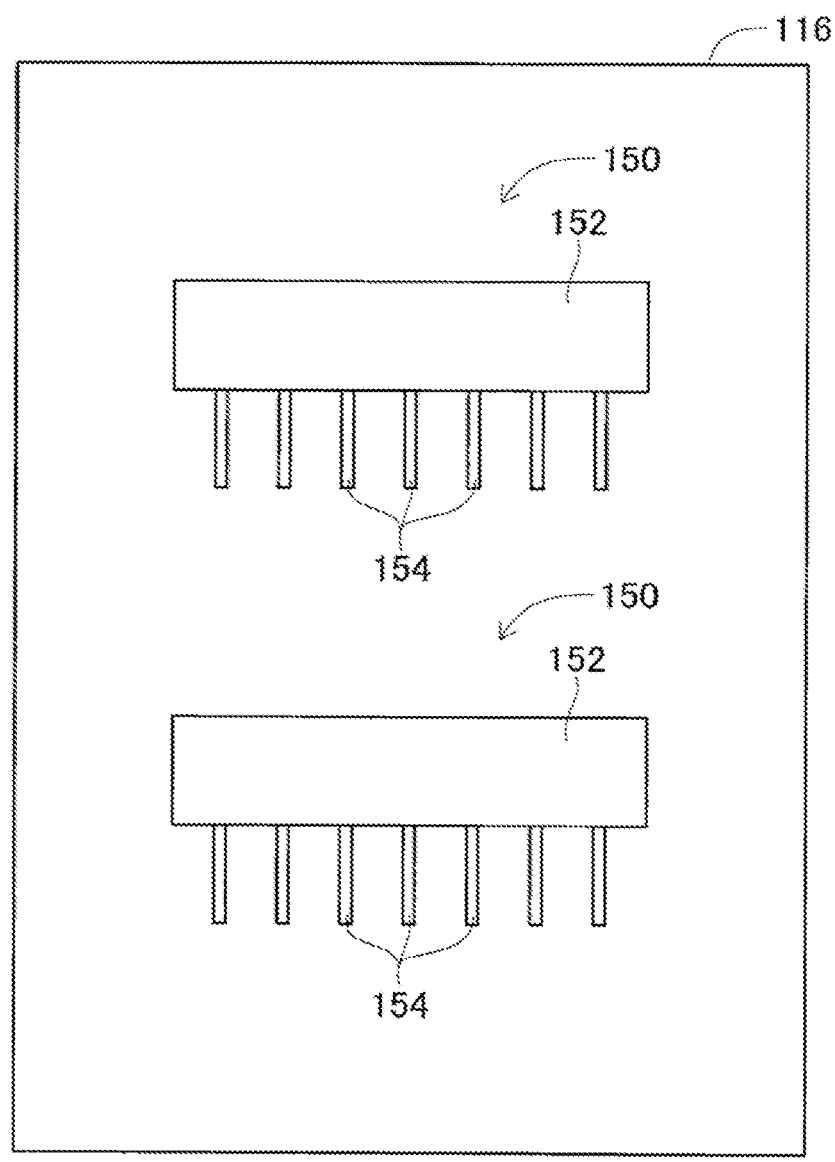
FIG. 6 A diagram showing a lead component placed on a tray.

Being configured as described above, component mounter 10 mounts components on circuit substrate 12 held by substrate conveyance and holding device 22. In component mounting machine 10, it is possible to mount various components, and the mounting operation of lead component 150 will be described below. Lead component 150, as shown in FIG. 6, consists of block-shaped component main body 152 and seven leads 154 protruding from the bottom face of component main body 152. The lengths of seven leads 154 are all the same.

Figure 7:
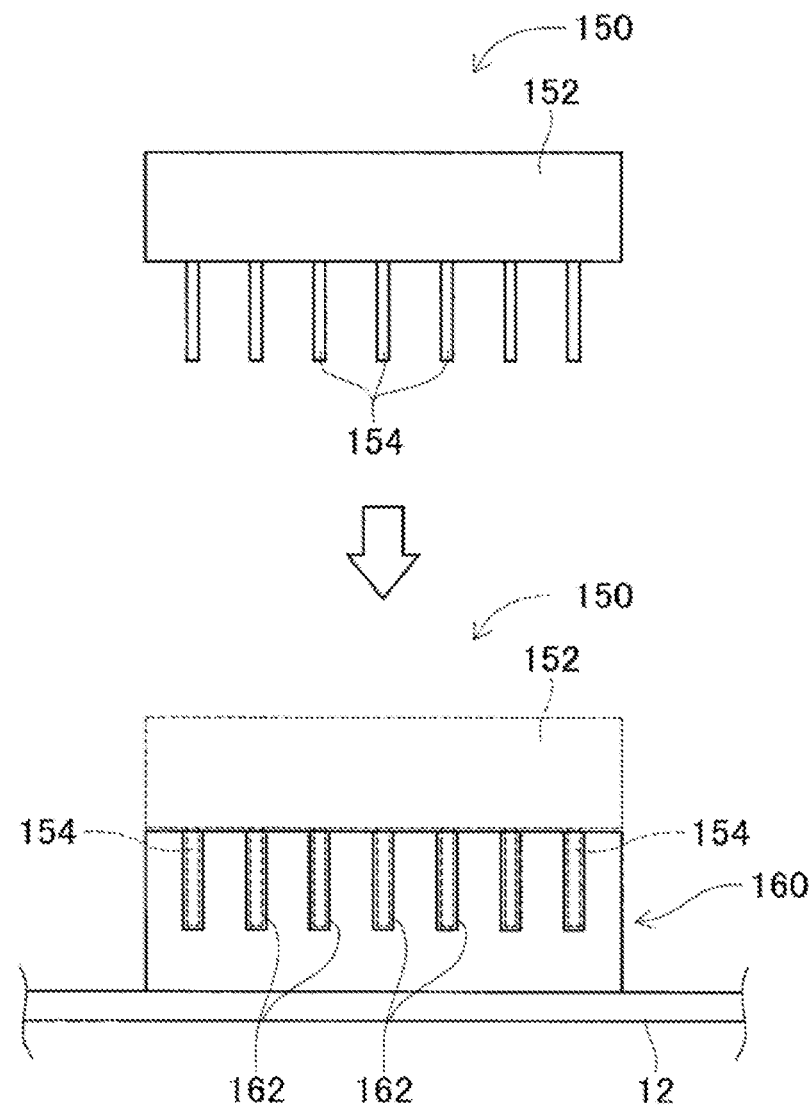
FIG. 7 A conceptual diagram showing a lead component when mounted on a connector component.

Further, in component mounting machine 10, component mounting work is performed on circuit substrate 12 conveyed in, but circuit substrate 12 with connector component (see FIG. 7) 160 already mounted is conveyed into component mounting machine 10. As shown in FIG. 7, connector component 160 has seven insertion holes 162, and lead component 150 is mounted in connector component 160 by way of seven leads 154 of lead component 150 being inserted into the seven insertion holes 162.

Specifically, when circuit substrate 12 in which connector component 160 is mounted is conveyed into component mounting machine 10, circuit substrate 12 is conveyed to the work position and is held by clamping device 52 in a fixed manner at the work position. Next, mark camera 26 is moved to a position above circuit substrate 12 and images circuit substrate 12. Then, based on the imaging data, controller 120 calculates the error in the holding position of circuit substrate 12 by clamping device 52, the positions of insertion holes 162 of connector component 160 mounted on circuit substrate 12, and the like.

Further, as shown in FIG. 6, in tray-type component feeder 110 of component supply device 30, lead component 150 placed on tray 116 is supplied. Lead component 150 is placed on top of tray 116 so that the bottom face of component main body 152 of lead component 150, from which leads 154 extend out, is perpendicular to the top face of tray 116 and a side face of component body 152 faces upward with leads 154 being extended parallel to the top face of tray 116. One of work heads 56, 58 is then moved by the operation of work head moving device 62 to a position above lead component 150 placed on tray 116 and a lateral face of component main body 152 of lead component 150 is picked up and held by suction nozzle 82. When lead component 150 is picked up and held by suction nozzle 82, as shown in FIG. 3, suction nozzle 82 is positioned in the non-pivoted position which is in a vertically downward direction. Therefore, lead component 150, held by suction nozzle 82 in the non-pivoted position, is in an orientation in which the lateral face of component main body 152 faces upward and leads 154 are directed laterally.

Then, when lead component 150 is held by suction nozzle 82, suction nozzle 82 pivots to the pivoted position, which is horizontal, by operation of nozzle pivoting device 84. In this situation, suction nozzle 82 is adjusted by the operation of nozzle rotation device 86 before holding lead component 150 so that leads 154 of lead component 150 held by suction nozzle 82 in the pivoted position will be directed vertically downward. That is, the pivoting angle of suction nozzle 82 is adjusted by the operation of nozzle rotation device 86 before suction nozzle 82 holds lead component 150 so that the pivoting direction of suction nozzle 82 coincides with the extending direction of leads 154 of lead component 150 placed on tray 116. In this way, lead component 150 held by suction nozzle 82 in the pivoted position is in an orientation in which leads 154 extend downward in the vertical direction.

Figure 8:
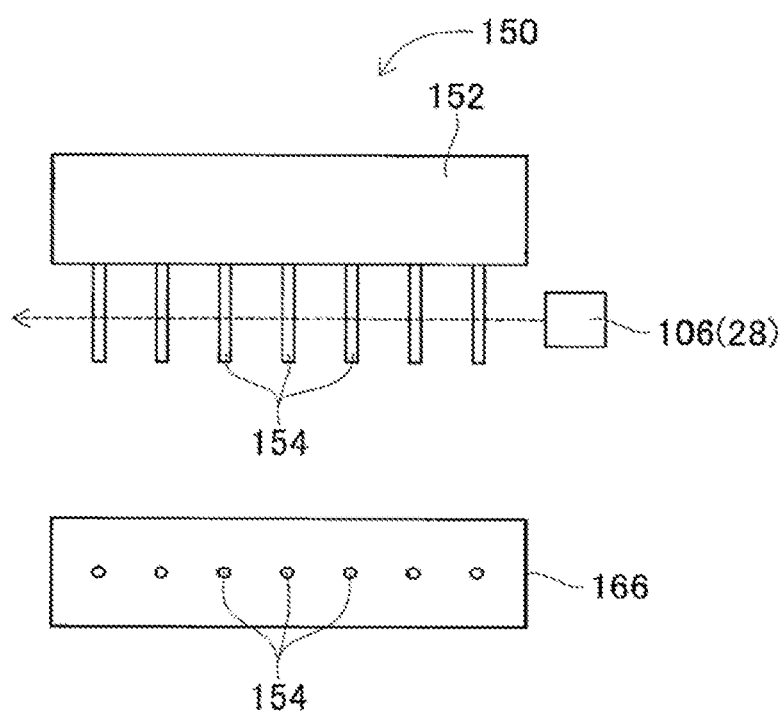
FIG. 8 A diagram showing a lead component at the time of imaging by the part camera and an image shown by imaging data acquired by imaging.

Next, when suction nozzle 82 pivots to the pivoted position, work head 56/58 moves above part camera 28 and leads 154 of lead component 150 held by suction nozzle 82 are imaged by part camera 28. Specifically, as work head 56/58 moved to a position above part camera 28 descends and all leads 154, that is, the seven leads, of lead component 150 held by suction nozzle 82 are irradiated with laser light emitted from laser irradiation devices 106 of part camera 28 from the side as shown in FIG. 8. At this time, the light irradiated from laser irradiation devices 106 is reflected by leads 154 of lead component 150 held by suction nozzle 82 and the reflected light falls on lens 102. The light incident on lens 102 enters imaging device 100 and is detected with the imaging element of imaging device 100. As a result, imaging data of the distal ends of leads 154 of lead component 150 held by suction nozzle 82 is obtained. Image 166 shown in FIG. 8 is an image of seven leads 154 shown by the imaging data from imaging device 100, and by analyzing the imaging data in controller 120 together with the timing of the imaging, the imaging height, and the like, the positions of all leads 154 of lead component 150 are calculated.

Next, the operations of X-direction moving device 63 and Y-direction moving device 64 are controlled so that the coordinates of the distal ends of leads 154 of lead component 150 in the XY-direction coincide with the coordinates of insertion holes 162 of connector component 160 in the XY-direction. As a result, when work head 56/58 is moved along the XY-direction, the positions of the distal ends of leads 154 of lead component 150 and the positions of insertion holes 162 of connector component 160 overlap in the up-down direction. Then, by the operation of Z-direction moving device 65, work head 56/58 is lowered and leads 154 of lead component 150 held by suction nozzle 82 are inserted into insertion holes 162 of connector component 160, as shown in FIG. 7. This mounts lead component 150 in connector component 160 already mounted on circuit substrate 12.

Figure 9:
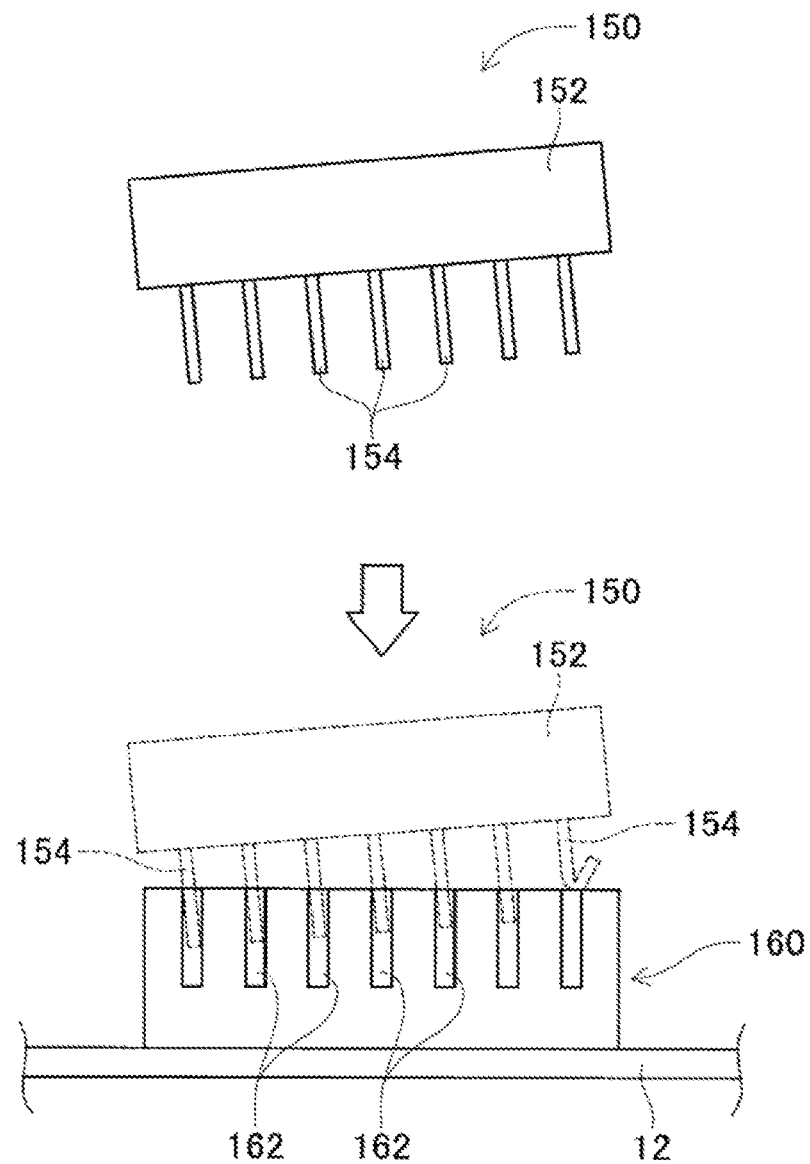
FIG. 9 A conceptual diagram showing a lead component being mounted on a connector component.

Thus, in component mounting machine 10, by way of leads 154 of lead component 150 being inserted into insertion holes 162 of connector component 160, lead component 150 is mounted to connector component 160. However, if lead component 150 held by suction nozzle 82 is tilted as shown in FIG. 9, when leads 154 are inserted into insertion holes 162 of connector component 160, there is a possibility that leads 154 will not be inserted into insertion holes 162 as a result of coming in contact with surfaces outside the insertion holes on the top surface of connector component 160 or inner wall surfaces of insertion holes 162. In addition, leads 154 may be bent and lead component 150 may become damaged.

Therefore, in component mounting machine 10, based on the imaging data of leads 154 of lead component 150 from part camera 28, the inclination of lead component 150 held by suction nozzle 82 is calculated and mounting work is executed taking the inclination into account. That is, the calculated inclination is corrected, and leads 154 of lead component 150 are then inserted into insertion holes 162 of connector component 160.

Figure 10:
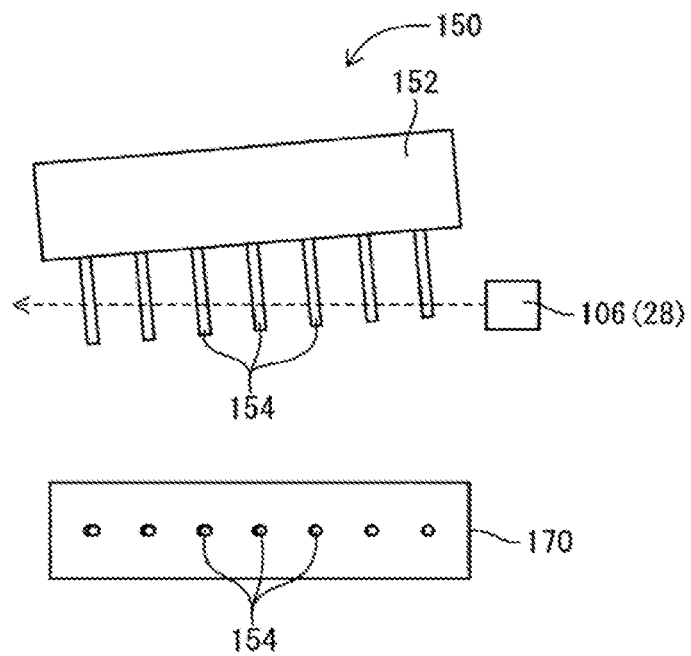
FIG. 10 A diagram showing a lead component at the time of imaging with the part camera and an image of the imaging data obtained by imaging.

Specifically, after lead component 150 is picked up by suction nozzle 82 and suction nozzle 82 is pivoted to the pivoting position, work head 56/58 moves to a position above part camera 28 by the operations of X-direction moving device 63 and Y-direction moving device 64 and is lowered by the operation of Z-direction moving device 65. At this time, as shown in FIG. 10, work head 56/58 is lowered to a position where laser light is irradiated to all leads 154 of lead component 150 by laser irradiation devices 106. When leads 154 are imaged with part camera 28, all leads 154, that is, seven leads 154, of lead component 150 are captured in image 170 based on the captured imaging data.

Then, without moving work head 56/58 in the right-left direction, leads 154 are imaged each time work head 56/58 is raised by a predetermined distance. That is, without operating X-direction moving device 63 and Y-direction moving device 64 and while work head 56/58 is raised at a constant speed by the operation of only Z-direction moving device 65, leads 154 are imaged each time a predetermined time has elapsed. Each time leads 154 are imaged, the imaging data is analyzed, and the height of lead component 150 when the number of leads 154 indicated by the imaging data (specifically, the number of end surfaces which are the distal ends of the leads) has changed and the number of leads at that time are stored, lead component 150 being the lead component held by work head 56/58 at the time of capturing the imaging data.

Figure 11:
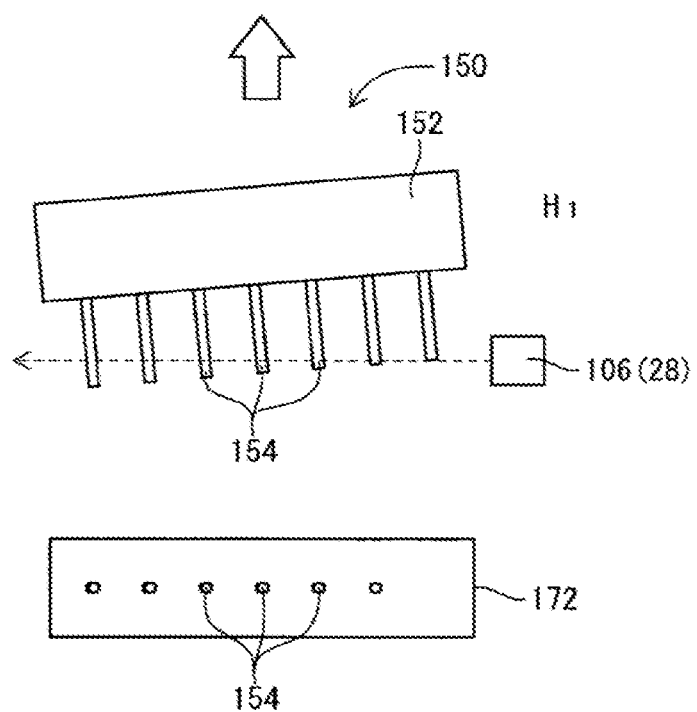
FIG. 11 A diagram showing a lead component at the time of imaging with the part camera and an image of the imaging data obtained by imaging.

For example, when work head 56/58 is raised from the position shown in FIG. 10 to the position shown in FIG. 11, at the position of work head 56/58 shown in FIG. 11, the laser beam irradiated from laser irradiation device 106 does not irradiate one lead of all leads 154, that is, seven leads of lead component 150 and irradiates only six leads. At this time, when leads 154 are imaged with part camera 28, in image 172 based on the captured imaging data, the laser light irradiated to six leads 154 of seven leads 154 of lead component 150 is reflected, and the six leads are captured as an image with the part camera. That is, as work head 56/58 is raised, the number of leads 154 indicated by the imaging data decreases from seven to six. Therefore, the height (H1) of work head 56/58 at the time of imaging at which the number of imaged lead distal ends changed and the numerical change in the number of imaged leads (1) are stored.

Figure 12:
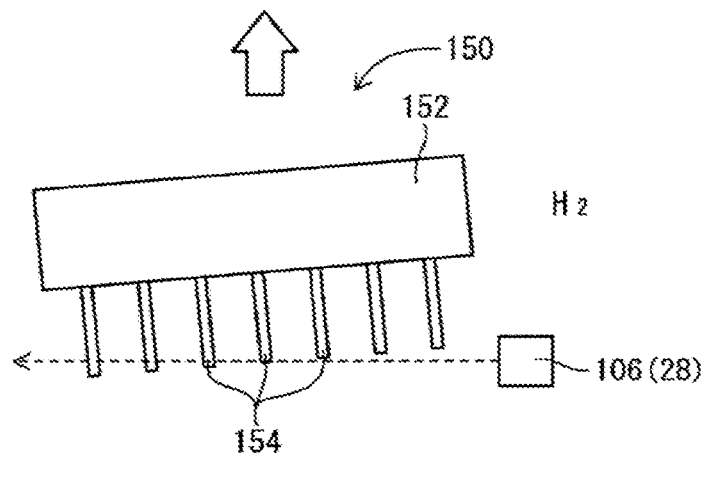
FIG. 12 A diagram showing a lead component at the time of imaging with the part camera and an image showing imaging data obtained by imaging.
Figure 12:
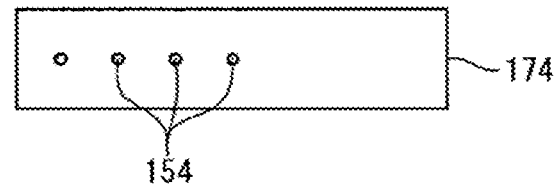

Subsequently, when work head 56/58 is further raised, as shown in FIG. 12, the laser light irradiated from laser irradiation device 106 is not irradiated to three leads of the seven leads of lead component 150 and is irradiated to only four leads. At this time, when leads 154 are imaged with part camera 28, in image 174 based on the captured imaging data, four leads 154 of seven leads 154 of lead component 150 are imaged. That is, as work head 56/58 is raised, the number of leads 154 indicated by the imaging data decreases from seven to four. As a result, the height (H2) of work head 56/58 at the time of imaging and the numerical change in the number of imaged leads (3) are stored.

Figure 13:
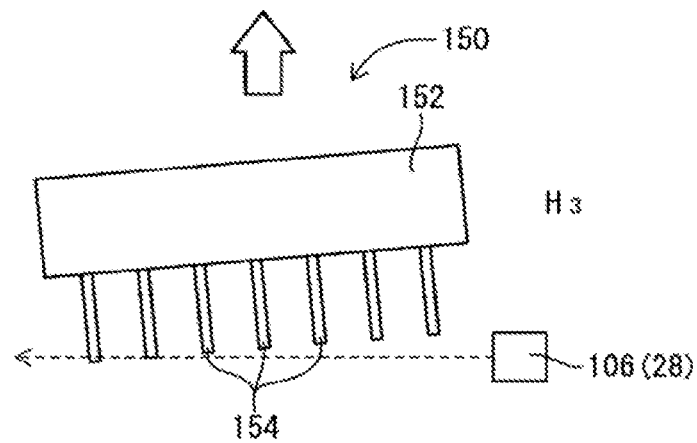
FIG. 13 A diagram showing a lead component at the time of imaging with the part camera and an image of showing imaging data obtained by imaging.
Figure 13:
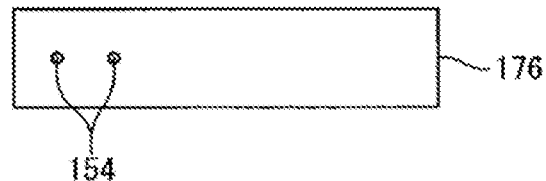

When work head 56/58 is further raised, as shown in FIG. 13, the laser light irradiated from laser irradiation device 106 is not irradiated to five leads of the seven leads of lead component 150 and is irradiated to only two leads. At this time, when leads 154 are imaged with part camera 28, in image 176 based on the captured imaging data, two leads 154 of seven leads 154 of lead component 150 are imaged. That is, as work head 56/58 is raised, the number of leads 154 indicated by the imaging data decreases from seven to two. As a result, the height (H3) of work head 56/58 at the time of imaging and the numerical change in the number of imaged leads (5) are stored.

Thus, when leads 154 are imaged multiple times while work head 56/58 is being raised, the inclination of lead component 150 is calculated based on the multiple pieces of imaging data obtained by imaging multiple times. That is, the inclination of lead component 150 is calculated based on imaging data captured at the times at which the number of leads 154 indicated by the imaging data changes.

Figure 14:
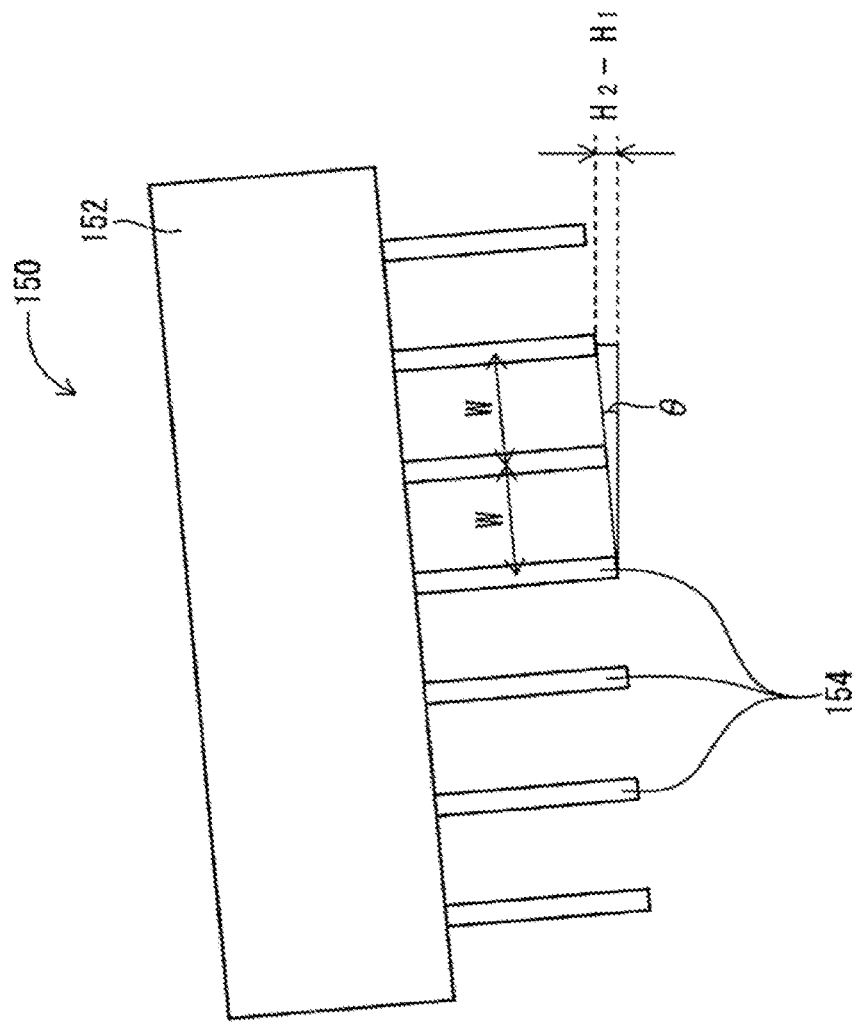
FIG. 14 A diagram conceptually showing the method of calculating the inclination angle of the lead component.

Specifically, in the imaging data (refer to FIG. 11) captured when the height of work head 56/58 is H1, the numerical change in the number of leads is 1, and in the imaging data (see FIG. 12) captured when the height of work head 56/58 is H2, the numerical change in the number of leads is 3. That is, while the position of work head 56/58 rises in the up-down direction from H1 to H2, two leads 154 rise upward from the laser light irradiation position. Therefore, as shown in FIG. 14, the following equation is satisfied if inter-lead distance is W. Note that inter-lead distance W is the distance between the center of the end face which is the distal end of a first lead 154 and the center of the end face which is the top of a second lead 154 located next to the first lead 154.

$$\sin \theta = (H2-H1)/2W$$

Thus, the inclination angle $\theta$ of lead component 150 is calculated. The inclination angle $\theta$ of lead component 150 is an angle indicating the inclination in the up-down direction of lead component 150, and is the inclination angle with respect to the right-left direction, or more strictly speaking, the horizontal direction. In other words, the inclination angle $\theta$ is an angle indicating the inclination in the right-left direction of leads 154, and is the inclination angle in which leads 154 extend out with respect to the up-down direction, or more strictly speaking, the vertical direction. This assumes that leads 154 of lead component 150 extend in a direction orthogonal to and linearly with respect to the plane from which leads of component main body 152 extend and that leads 154 are not warped or bent.

Figure 15:
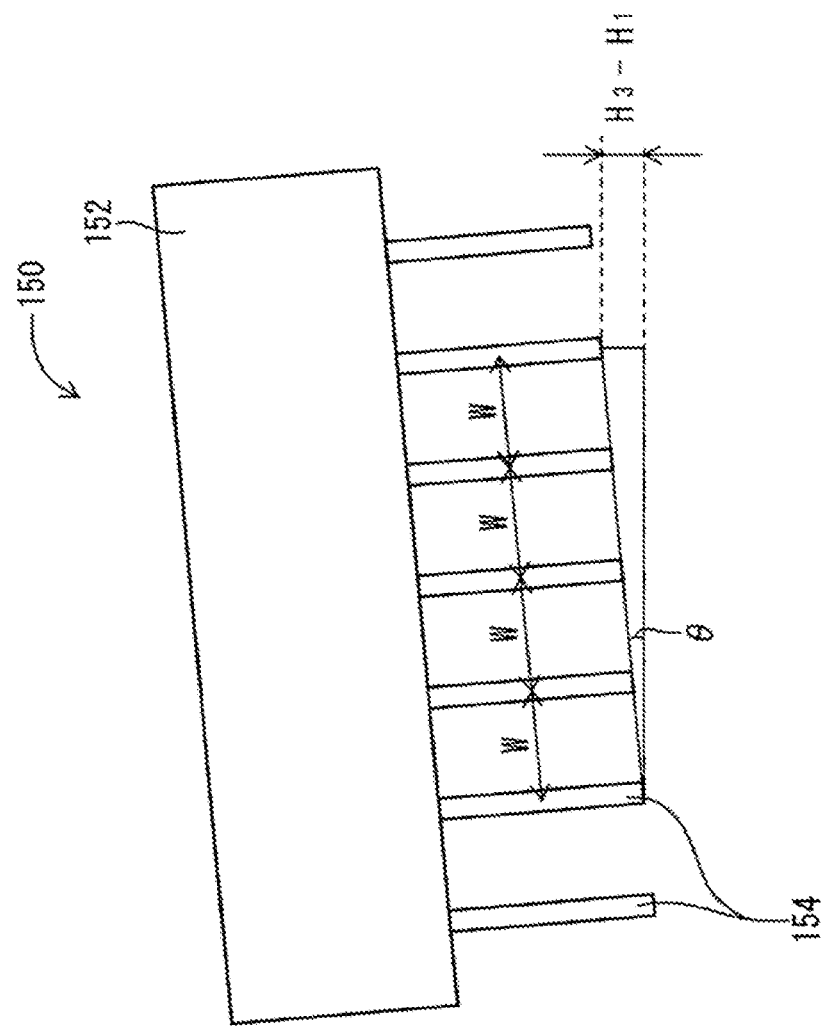
FIG. 15 A diagram conceptually showing the method of calculating the inclination angle of the lead component.

In the imaging data (see FIG. 11) captured when the height of work head 56/58 is H1, the numerical change in the number of leads is 1, and in the imaging data (see FIG. 13) captured when the height of work head 56/58 is H3, the numerical change in the number of leads is 5. That is, while work head 56/58 is raised from H1 to H3, four leads 154 are raised above the laser light irradiation position. Therefore, as shown in FIG. 15, the following equation is satisfied if inter-lead distance is W.

$$\sin \theta = (H3-H1)/4W$$

Thus, the inclination angle $\theta$ of lead component 150 is calculated.

Figure 16:
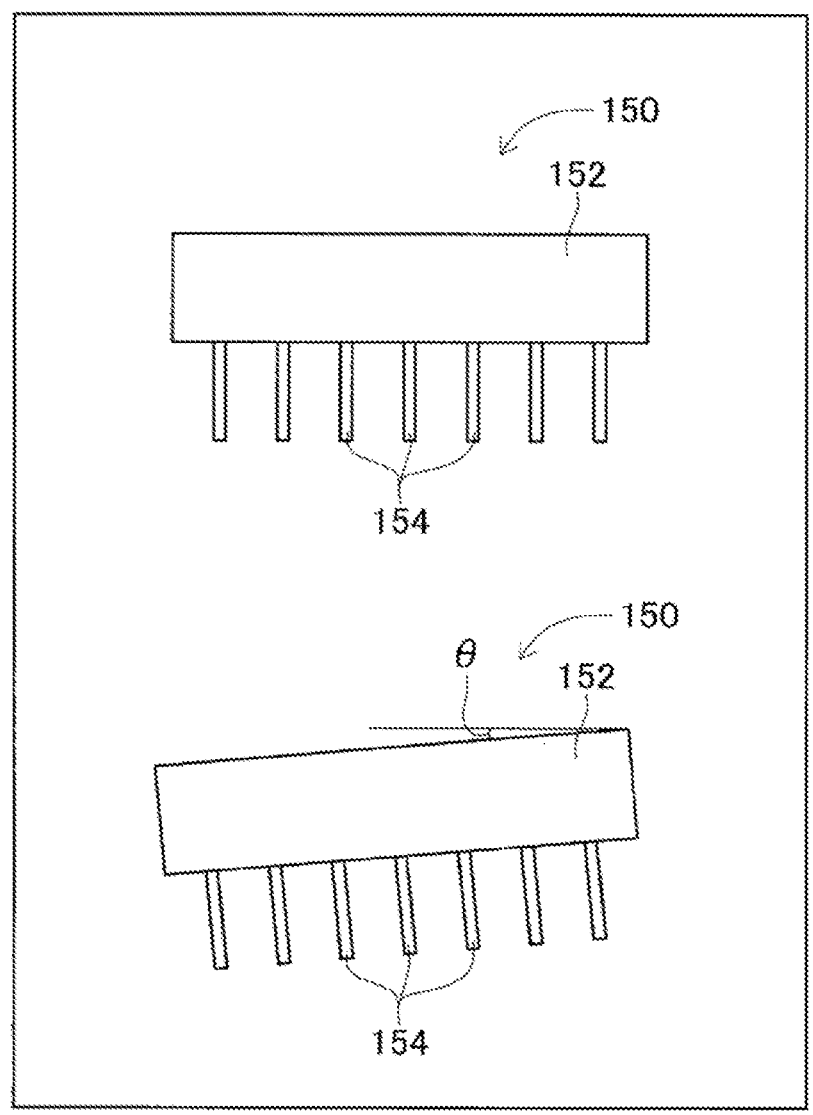
FIG. 16 A diagram showing a lead component placed on a tray.

Incidentally, the average value of the values calculated in the above two equations is considered the inclination angle $\theta$ of lead component 150. Then, when the inclination angle $\theta$ of lead component 150 is calculated, mounting work is executed taking the inclination angle $\theta$ into account. First, as a factor which may have caused the inclination of lead component 150 held by suction nozzle 82, one possibility is that lead component 150 was placed on tray 116 in an inclined manner before being held by suction nozzle 82. That is, as shown in FIG. 16, in a case in which lead component 150 shown in the upper portion of the figure is placed on tray 116 with no angle, lead component 150 shown in the lower portion of the figure is placed on tray 116 with a predetermined angle $\theta$. In such a case, when lead component 150 placed in this manner with an inclination is held by suction nozzle 82, lead component 150 held by suction nozzle 82 may be inclined with a predetermined angle $\theta$.

In view of this, when the inclination angle $\theta$ of lead component 150 is calculated as described above, lead component 150 held by suction nozzle 82 is returned onto tray 116 so as to be placed on tray 116 without an inclination. Specifically, when the inclination angle $\theta$ of lead component 150 is calculated, suction nozzle 82 is first pivoted from the pivoted position, in which the lead component is held, to the non-pivoted position. Next, in the non-pivoted position, suction nozzle 82 is rotated about the vertical axis by an angle corresponding to an angle obtained by adding or subtracting the calculated inclination angle $\theta$. Work head 56/58 then moves above tray 116, and lead component 150 held by suction nozzle 82 is placed on tray 116. Thus, lead component 150 held in an inclined manner by suction nozzle 82, that is, lead component 150 placed on tray 116 in an inclined manner before being held by suction nozzle 82, as shown in FIG. 6, is placed on tray 116 without an inclination by correcting the inclination having an inclination angle of $\theta$.

Then, when lead component 150 held by suction nozzle 82 is returned onto tray 116, lead component 150 is picked up again by suction nozzle 82. Holding of lead component 150 by suction nozzle 82 is performed by the same method as described above. As a result, lead component 150 can be picked up by suction nozzle 82 without an inclination. Then, lead component 150 held without inclination by suction nozzle 82 is mounted to connector component 160. In this way, in component mounting machine 10, based on the imaging data of leads 154 of lead component 150 by part camera 28 which images in an upward direction, the inclination of lead component 150 held by suction nozzle 82 is calculated and mounting work taking into account the inclination is executed. As a result, it is possible to appropriately perform the mounting work of lead component 150.

Further, in component mounting machine 10, mounting work is performed taking into account the inclination of lead component 150 with a method different from the above-described method, that is, a method in which lead component 150 held in suction nozzle 82 is returned to tray 116 utilizing the calculated inclination angle θ of lead component 150. Specifically, based on the calculated inclination angle θ of lead component 150, the deviation amount OXY of the coordinates in the XY-direction of the ends of leads 154 on the component main body 152 side, that is, the proximal ends of leads 154 and the coordinates in the XY-direction of the distal ends of leads 154 are calculated.

Figure 17:
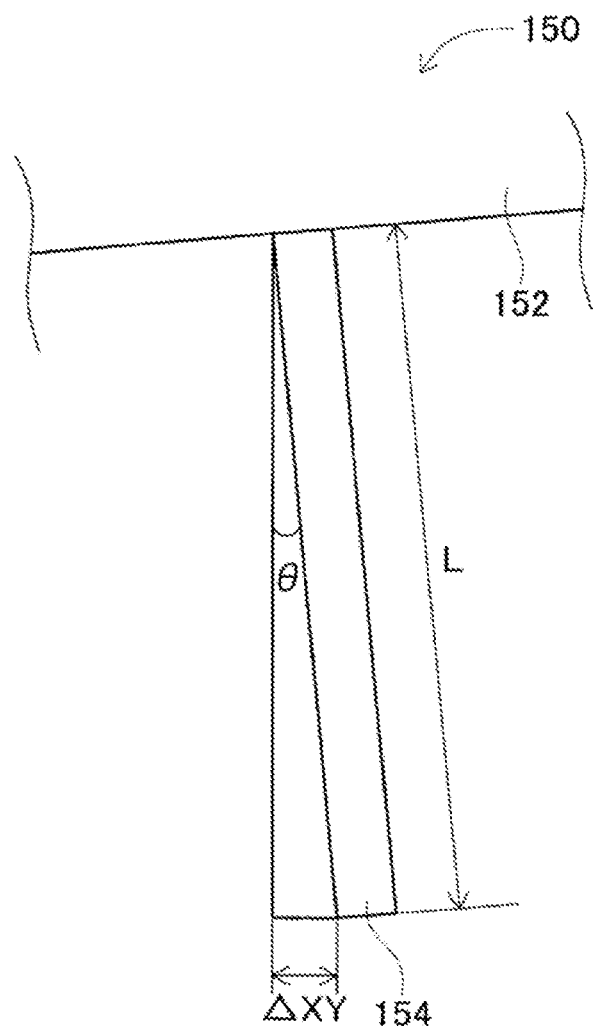
FIG. 17 A diagram conceptually showing a method of calculating the deviation amount in the XY-direction of the leads caused by the inclination of the lead component.

Specifically, as described above, since the inclination angle θ of lead component 150 can also be said to be the inclination angle in the direction in which leads 154 extend from the component main body 152 side with respect to the vertical direction, the following equation holds when the length of leads 154 is L as shown in FIG. 17.

$$\sin \theta = L/\Delta XY$$

Using this, the deviation ΔXY in the coordinates in the XY-direction of the proximal ends of leads 154 and the coordinates in the XY-direction of the distal ends of leads 154 is calculated.

Figure 18:
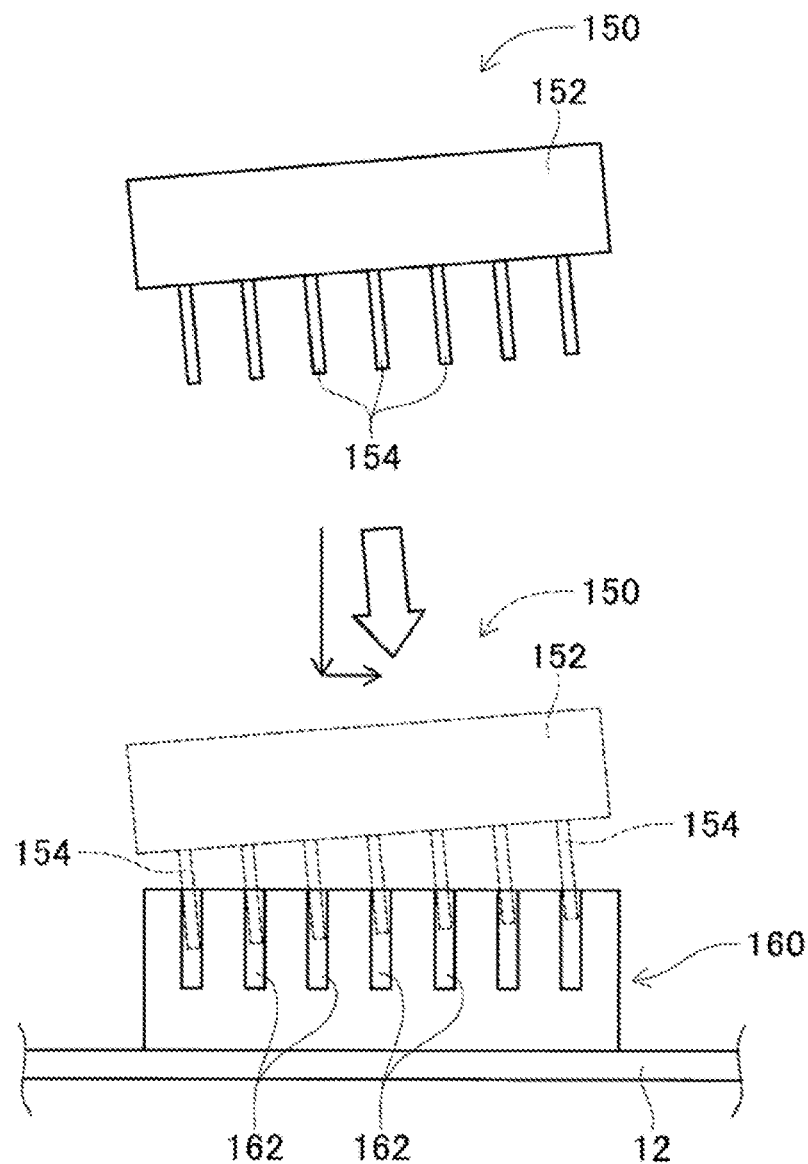
FIG. 18 A conceptual diagram showing a lead component being mounted on the connector component.

The operation of work head moving device 62 is controlled by combining the calculated deviation ΔXY in the XY-direction and the lowering amount in the Z-direction of work head 56/58 necessary to insert leads 154 of lead component 150 into insertion holes 162 of connector component 160. That is, as shown in FIG. 18, the operation of work head moving device 62 is controlled by combining the movement in the lateral direction by X-direction moving device 63 and Y-direction moving device 64 with the movement in the vertical direction by Z-direction moving device 65. As a result, moving in the right-left direction while work head 56/58 is lowered allows leads 154 of lead component 150 in the inclined state to be properly inserted into insertion holes 162 of connector component 160 regardless of the inclination angle θ of lead component 150. That is, by performing control so as to coordinate right-left movement and up-down movement, leads 154 of lead component 150 in the inclined state can be properly inserted into insertion holes 162 of connector component 160. In the up-down direction, for the segment after the distal ends of leads 154 are inserted into insertion holes 162 until the proximal ends of the leads are inserted into insertion holes 162, movement in the right-left and up-down directions are controlled in a coordinated manner, and for the segment from the start of lowering work head 56/58 to when the distal ends of leads 154 are inserted into insertion holes 162, by directing the movement in a coordinated manner as the leads are inserted along the insertion holes, warping of the leads by the leads coming in contact with the insertion holes is less likely to occur, and the load on the lead component is reduced compared with the case of directing movement in a straight line without controlling in the right-left direction. Such a load can be detected by the moving torque of the moving device for operating the work head. If the load is equal to or greater than the threshold, it is determined that the component is warped or bent between the lead distal end and the component main body surface, that is, the component is an unsuitable component.

However, if the inclination angle θ of lead component 150 is too large, even if an attempt is made to insert leads 154 into insertion holes 162 by combining the movement of work head 56/58 in the right-left direction and the movement in the up-down direction, there is a possibility that leads 154 cannot be properly inserted into insertion holes 162. Therefore, when the calculated inclination angle θ of lead component 150 is larger than a threshold value, lead component 150 held by suction nozzle 82 is discarded as a pickup error in a discard box (not shown).

Lead component 150 held by suction nozzle 82 may tilt due not only to the orientation of lead component 150 placed on tray 116 but also to the structure of work head 56/58. Specifically, for example, there are cases in which lead component 150 held by suction nozzle 82 tilts due to a deviation in the holding angle of suction nozzle 82 by holder 88, a deviation of support shaft 92 in holder 88, a deviation in the rotation angle of suction nozzle 82 by nozzle pivoting device 84, and the like. Therefore, in component mounting machine 10, before mounting work is executed, the inclination angle of a master component is calculated using a master component of lead component 150.

Specifically, lead component 150 having a high dimensional accuracy is used as a master component. That is, lead component 150 used as a master component is manufactured with a range of error that is considerably smaller than the allowable tolerance with respect to the length of leads 154, the extending direction of leads 154 from component main body 152, the flatness of each surface of component main body 152, and the like. The inclination angle of the master component held by suction nozzle 82 is then calculated according to the same method as lead component 150 used in the mounting work. In this case, the inclination angle of the calculated master component is considered to be caused by the structure of work head 56/58. Therefore, the master component is held by the work head, imaged in the same manner as the lead component, and when the inclination angle calculated based on the image data is larger than a threshold value, the calculated data is identified as being due to work head 56/58, and the operator is notified of this information through an operation panel or the like, and exchange, inspection, repair, or the like of the work head, holding tool provided in the work head, or a component constituting the work head, for which the notification pertains to, is performed. On the other hand, when the work head holds the master component and the inclination angle of the master component calculated based on the imaging data of the held master component is equal to or less than the threshold value, with the inclination angle of the master component being considered a characteristic value of the work head that holds the master component, the mounting work is executed taking the inclination angle of the master component into account in the inclination angle θ of lead component 150 during the mounting work. As a result, even when lead component 150 held by suction nozzle 82 is inclined due to the structure of work head 56/58, it is possible to ensure appropriate mounting work of lead component 150.

Component mounting machine 10 is an example of a work machine. Part camera 28 is an example of an imaging device. Control device 36 is an example of a control device. Work head 56/58 is an example of a work head. Work head moving device 62 is an example of a moving device. Lead component 150 is an example of an electrical component. Lead 154 is an example of a lead terminal.

In addition, the present disclosure is not limited to the above examples, and can be implemented in various modes with various changes and improvements based on the knowledge of those skilled in the art. Specifically, for example, in the above embodiment, the inclination of the component is calculated based on the imaging data of leads 154 of lead component 150, but the inclination of the component may be calculated based on the imaging data of a lead terminal such as a pin, a terminal, or a bump. That is, various types of lead terminals, such as insertion holes, through holes, recesses, hooks, positioning portions, and the like, can be applied to the present disclosure. Further, the present embodiment is practical from the standpoint that leads 154 are tangible positioning portions, given that in order to insert leads 154 of lead component 150 into insertion holes 162 of connector component 160, the inclination of the component is obtained by imaging the multiple leads 154 and calculating the inclination. On the other hand, even if all multiple leads 154 are bent in a predetermined direction from a direction orthogonal to the plane which leads 154 extend from component main body 152, the component can be mounted to the connector if the distance between each lead is maintained constant.

Further, in the above embodiment, leads 154 are imaged by raising work head 56/58 at the time of imaging, but lead 154 may be imaged by lowering work head 56, 58 at the time of imaging. Alternatively, leads 154 may be imaged while repeating the up-down movement. Incidentally, the up-down direction here, is not limited to the Z-direction, or strictly speaking, the vertical direction, but is a concept which includes obliquely upward directions and obliquely downward directions.

Further, in the above embodiment, lead component 150 is mounted to connector component 160 mounted on circuit substrate 12. That is, lead component 150 is indirectly mounted to circuit substrate 12 via connector component 160. On the other hand, lead component 150 may be directly attached to circuit substrate 12. That is, lead component 150 may be attached to circuit substrate 12 by way of leads 154 of lead component 150 being inserted into through holes or the like in circuit substrate 12.

Further, in the above embodiment, lead component 150 is placed on the tray with the placement surface being a surface other than the surface which leads 154 extend from component main body 152, but the surfaces of extended leads, that is, the distal ends thereof may be set as the placement surface. If components are placed in such an orientation, nozzle pivoting device 84 does not need to be actuated nor is nozzle pivoting device 84 itself necessary. However, if components are placed in such an orientation, there is also the problem that the position of leads 154 cannot be imaged by imaging from above. In addition, as in the present embodiment, in addition to being able to acquire the inclination angle of the component held in the actual mounting orientation, the same method is applied due to the fact that the cause can be estimated to be on the side of the work head holding the component.

Further, when lead component 150 is placed on the tray with the surface extended by lead 154, that is, with the distal ends of leads 154 as the placement surface, the positions of leads 154 cannot be imaged by imaging from above, as described above. Therefore, when lead component 150 is placed in such an orientation, it is impossible to calculate the inclination angle of the component from the imaging data by imaging from above. Further, even in the case in which lead component 150 is placed with a placement surface other than the surface which leads 154 extend from component main body 152, the inclination angle cannot be calculated from the imaging data by imaging from above even if the placement surface is inclined in the up-down direction with respect to the top surface of the tray, that is, the horizontal plane. On the other hand, in such a case, the three-dimensional inclination angle of the component can be calculated by applying the present disclosure. That is, lead component 150 is held by work head 56/58 in an orientation in which leads 154 face downward, and by imaging lead component 150 held by work head 56/58 from below, the three-dimensional inclination angle of the component can be calculated based on the imaging data.

Further, in the above embodiment, although the inclination in the up-down direction of lead component 150 is calculated, the inclination in the right-left direction of the component, the inclination in the axial direction of a predetermined axis, various inclinations such as the inclination with respect to a predetermined plane, and the like may be calculated.

Further, in the above embodiment, by returning the component held by suction nozzle 82 to tray 116 or by controlling the right-left direction and the up-down direction of work head 56/58 in a coordinated manner based on the inclination angle of the component, mounting work in which the inclination angle of the component is corrected is executed. Mounting work in which the inclination angle is corrected may be performed not only by this method but by other methods as well. For example, mounting work may be executed by pivoting suction nozzle 82 with nozzle pivoting device 84 by correcting the inclination angle of the component held in the suction nozzle. In such a case, the component is returned to the tray or mounted by lowering the lead component held in the work head only in the Z-axis direction.

Further, in the above embodiment, an XYZ-type robot was used as a moving device for moving work head 56/58, but an XY-type robot may be used. However, in the case where an XY-type robot is used, the moving device is a device including a lifting and lowering device or the like for lifting and lowering suction nozzle 82. A multi-joint type robot arm can also be used as a moving device. Since a multi-joint robot arm is movable in all directions due to each axis operating in a coordinated manner, by employing a multi-joint robot arm, the right-left movement and up-down movement of work head 56/58 are utilized and can be suitably controlled.

In the above embodiment, although leads 154 are imaged multiple times while work head 56/58 is raised, leads 154 may be continuously imaged one time. That is, by increasing the exposure time, leads 154 may be continuously imaged while work head 56, 58 is raised.

Further, in the above embodiment, the inclination of lead component 150 is calculated based on the imaging data captured at the timing when the number of leads 154 of lead component 150 indicated by the imaging data changes, but the timing is a concept including the period from the time when the number of leads 154 changes to the time a predetermined time elapses.

In the above embodiment, lead component 150 having high dimensional accuracy is used as the master component, but as long as the leads can be reproduced with high accuracy, it is possible to use a variety of lead components 150. For example, a shape similar to leads 154 that reflects light by printing or the like may be formed on a predetermined surface of the block-shaped component, and the inclination of the component may be calculated based on the imaging data of the formed shape.

Further, the light irradiated from the side at the time of imaging of the leads is not limited to laser light. In order to accurately determine the position of the distal ends of leads, it is desirable to use not diffuse light but parallel light and to limit the width of the light to be irradiated.

In the above embodiment, suction nozzle 82 is used as a holding tool for holding the component, but a chuck or the like having multiple gripping claws may be used.

REFERENCE SIGNS LIST

10: Component mounting machine (work machine), 28: Part camera (imaging device), 36: Control device, 56: Work head, 58: Work head, 62: Work head moving device, 150: Lead component (electrical component), 154: Lead (lead terminal)

The invention claimed is:

1. A work machine for performing a mounting work of an electrical component, the work machine comprising:
   a work head including a holder configured to pick up and hold the electrical component having multiple lead terminals;
   a moving device configured to move the work head in each of an X-direction, a Y-direction, and a Z-direction;
   a camera configured to image the electrical component held with work head while being illuminated from a side; and
   a control device configured to:
      calculate an inclination angle of the electrical component held by the work head indicating an inclination in the Z-direction based on imaging data of lead terminals of the electrical component imaged by the camera while the work head is moved in the Z-direction by the moving device,
      control the work head and the moving device to place the electrical component on a tray while correcting the inclination angle by controlling the moving device to move in the X-direction and the Y-direction by a deviation amount based on the inclination angle, and
      control the work head to pick up the electrical component from the tray after correcting the inclination angle and perform the mounting work.

2. The work machine of claim 1, wherein the control device calculates the inclination angle of the electrical component held by the work head based on multiple pieces of the imaging data of lead terminals of the electrical component imaged multiple times by the camera while the work head is moved in the Z-direction by the moving device.

3. The work machine of claim 1, wherein the control device calculates the inclination angle of the electrical component held by the work head based on the imaging data captured at a timing at which a number of lead terminals of the electrical component indicated by the imaging data changes.

4. The work machine of claim 1, wherein
   the work head holds a master component of the electrical component having multiple lead terminals;
   the camera images the master component held by the work head; and
   the control device calculates the inclination angle of the master component held by the work head based on the imaging data of the master component imaged by the camera while the work head is moved in the Z-direction by the moving device.

5. The work machine of claim 1, wherein the work head rotates the electrical component to correct the inclination angle prior to placing the electrical component on the tray.

* * * * *